(12) United States Patent
Sato et al.

(10) Patent No.: US 6,413,442 B2
(45) Date of Patent: Jul. 2, 2002

(54) METHOD OF PRODUCING SINGLE CRYSTAL AND PIEZOELECTRIC ELEMENT

(75) Inventors: Jun Sato; Katsumi Kawasaki, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/860,573

(22) Filed: May 21, 2001

(30) Foreign Application Priority Data

May 22, 2000 (JP) ......................................... 2000-150245

(51) Int. Cl.[7] .......................... C04B 35/26; C04B 35/64; H01F 1/00
(52) U.S. Cl. .......................... 252/62.62; 117/1; 117/13; 117/937; 252/62.62; 423/328.2
(58) Field of Search .............................. 117/1, 13, 937; 252/62.62, 62.63, 62.64, 62.9 R; 423/328.2

(56) References Cited

FOREIGN PATENT DOCUMENTS

JP          A 11-171696          6/1999

OTHER PUBLICATIONS

B.V. Mill et al., Journal Organic Chemistry, vol. 43, No. 8, pp. 1270–1277, 1998.

*Primary Examiner*—Felisa Hiteshew
(74) *Attorney, Agent, or Firm*—Oliff & Berridge, PLC

(57) ABSTRACT

A method of producing a single crystal of the composition $M_3NbGa_3Si_2O_{14}$ (where M is an alkaline earth metal) comprising growing in a lattice direction inclined at an angle of 50.8 to 90 degrees from a [001] axis. The single crystal obtained in this way may be suitably used as a component of a resonator, filter, or other various piezoelectric elements.

15 Claims, 11 Drawing Sheets

METHOD OF PRODUCING SINGLE CRYSTAL AND PIEZOELECTRIC ELEMENT

BACKGROUND OF THE INVENTION

1. Field of the Invention

The present invention relates to a method of producing a single crystal of a composition $M_3NbGa_3Si_2O_{14}$ useful as a piezoelectric material and a piezoelectric element made using the same.

2. Description of the Related Art

Up until now, the only reports regarding a single crystal of the composition $M_3NbGa_3Si_2O_{14}$ (where M in the composition is an alkaline earth metal) having a $Ca_3Ga_2Ge_4O_{14}$ structure (space group P321) have been findings on powder X-ray diffraction and structural analysis of $Ca_3NbGa_3Si_2O_{14}$ in Japanese Unexamined Patent Publication (Kokai) No. 11-171696 and the report of B. V. Mill et al. (Zh. Neorg. Khim., 1998, vol. 43, no. 8). There have not been any reports on growth of large, good quality single crystals.

Attempts have however been made to grow a single crystal by the Czochralski method (CZ method) of dipping a seed crystal in a melt in a crucible, pulling it up while rotating it, and thereby growing a single crystal at the lower end of the seed crystal for numerous compositions having a $Ca_3Ga_2Ge_4O_{14}$ structure.

When trying to grow either $Ca_3NbGa_3Si_2O_{14}$ or $Sr_3NbGa_3Si_2O_{14}$ using a seed crystal of a [001] orientation as found in many examples of growth of other compositions, as shown in FIG. 1 and FIG. 2, polycrystallization occurred immediately after the start of growth and a good single crystal could not be obtained.

SUMMARY OF THE INVENTION

An object of the present invention is to provide a method of producing a single crystal of a composition $M_3NbGa_3Si_2O_{14}$ (where M is an alkaline earth metal) having sufficient quality as a piezoelectric material and a piezoelectric element made using the same.

The present inventors engaged in in-depth studies on in what crystal orientation the crystal should be grown in order to achieve the object of the present invention taking into consideration the fact that a single crystal having a lattice direction identical to the lattice direction of the seed crystal used for pullup grows at the lower end of the seed crystal, for example, the Czochralski method, and as a result discovered that by growing the crystal in an orientation inclined by a predetermined angle from the [001] axis, more specifically by pulling up the crystal while bringing the melt into contact with the face inclined by a predetermined angle from the [001] axis of the seed crystal, a single crystal of a specific composition having sufficient quality as a piezoelectric material can be obtained and thereby completed the present invention.

According to a first aspect of the present invention, there is provided a method of producing a single crystal of a composition $M_3NbGa_3Si_2O_{14}$ (where M is an alkaline earth metal) comprising growing the crystal in a lattice direction inclined by an angle of 50.8 to 90 degrees from a [001] axis, preferably 51.4 to 90 degrees, particularly preferably 90 degrees. The closer the angle of inclination from the [001] axis to 90 degrees, the greater the size of the single crystal and the better the productivity of the single crystal.

According to a second aspect of the present invention, there is provided a method of producing a single crystal comprising pulling a seed crystal up while bringing a face, inclined at an angle of 50.8 to 90 degrees from a [001] axis of the seed crystal, into contact with a melt in a crucible, so that a single crystal of a composition $M_3NbGa_3Si_2O_{14}$ (where M is an alkaline earth metal) is grown at a lower end of the seed crystal.

The first and second aspects of the invention preferably the single crystal is grown at an angle ($\psi$) of an enlarged crystal part of the crystal so as to satisfy the following formula when a pullup direction of the single crystal of said composition is made a direction "v" rotated by $\phi$ ($50.8 \leq \phi \leq 90$) from the [001] axis in a plane including the [001] axis toward a vector "$v_{a1}$" extending in a direction vertical to the [001] axis and rotated $\theta$ ($0 \leq \theta \leq 30$) from a [100] axis, "a" and "c" are lattice constants, and $\psi$ is an angle of the enlarged crystal part:

$$\psi \leq 2\cos^{-1}((2\sin\phi\cos\theta/a + \cos\phi/c)/((2/a)^2 + (1/c)^2)^{1/2})$$

In the first and second aspects of the invention and their embodiments, preferably said alkaline earth metal is any one of Ca and Sr.

The first and second aspects of the invention preferably the crystal is grown at the angle of the enlarged crystal part of less than 78.4 degrees when pulling up the crystal in the [100] direction.

The first and second aspects of the invention preferably the crystal is grown at the angle of the enlarged crystal part of less than 95.6 degrees when pulling up the crystal in a [120] direction.

According to third aspect of the present invention, there is provided a seed crystal comprised of a composition $M_3NbGa_3Si_2O_{14}$ (where M is an alkaline earth metal) and having a face of which a crystal orientation inclined at an angle of 50.8 to 90 degrees from a [001] axis, preferably 51.4 to 90 degrees, particularly preferably 90 degrees.

According to fourth aspect of the present invention, there is provided a single crystal comprised of a composition $M_3NbGa_3Si_2O_{14}$ (where M is an alkaline earth metal) and having a face of which a crystal orientation inclined at an angle of 50.8 to 90 degrees from a [001] axis, preferably 51.4 to 90 degrees, particularly preferably 90 degrees.

The single crystal according to the present invention can be suitably used as a component of a resonator, filter, or other various types of piezoelectric elements.

According to fifth aspect of the present invention, there is provided a piezoelectric element comprised of a single crystal including a composition $M_3NbGa_3Si_2O_{14}$ (where M is an alkaline earth metal) and having a face of which a crystal orientation inclined at an angle of 50.8 to 90 degrees from a [001] axis, preferably 51.4 to 90 degrees, particularly preferably 90 degrees.

Note that in the present specification, the "enlarged crystal part" means the shoulder enlarged to a predetermined size in the single crystal grown at the lower end of the seed crystal (corresponding to reference numeral 30 in FIG. 6B). The angle of the enlarged crystal part is the angle of the enlarged crystal part with respect to the pullup direction (corresponding to $2\omega$ in FIG. 6B).

Further, in the present invention, for example, when expressing the "(hk1) plane", this is indicated as "(hk*1)".

$Ca_3NbGa_3Si_2O_4$ Composition

The single crystal having a $Ca_3Ga_2Ge_4O_{14}$ structure in previous reports on crystal growth, like the many oxide single crystals currently industrialized, are grown by pulling the crystals up by the Czochralski method in the [001] direction (=z-axis=c-axis, see FIG. 13). No problem of polycrystallization occurred so long as the temperature gradient at the time of growth was held in a suitable range.

FIG. 13 is a schematic view for explaining the pullup direction of the crystal.

For a $Ca_3NbGa_3Si_2O_{14}$ composition, however, when actually growing a crystal by pulling it up in the [001] direction, as shown in FIG. 1, polycrystallization occurs immediately after the start of the growth, then a transparent crystal portion was obtained in a growth orientation vertical to the [120] direction (=y-axis, see FIG. 13) and inclined in the [100] direction (=x-axis =a1 axis, see FIG. 13). The obtained transparent crystal portion was cut out and used as a seed crystal for growth of a single crystal, whereupon, as shown in FIG. 3, a crystal having a twinning plane was obtained. FIG. 1 and FIG. 3 are both views of examples of growth of $Ca_3NbGa_3Si_2O_{14}$ by methods of the related art.

The twinning plane of the obtained crystal was examined in detail, whereupon it could be confirmed that the normal vector had an inclination of about 10 degrees with respect to the [100] direction from the [001] direction. The (21*0) plane (=x-plane) of the twinning plane was measured for lattice direction by a Laue camera, whereupon it could be confirmed that the regions at the two sides of the twinning plane were offset by about 20 degrees in the [001] direction. From these results, as the twinning plane, either the 116 ([001] direction and 11.6 degrees) and the 117 ([001] direction and 9.9 degrees) may be considered, but the 117 facet with a good match with the measured value was judged as the twinning plane.

Note that in the present specification, the plane described as "hk1", since {hk1} and {h*k*1} are deemed equivalent, expresses all of (hk1), (k(h+k)*1), ((h+k)*h1), (h(h+k)*1*), ((h+k)*k1*), (kh1*), (h*k*1), (k*(h+k)1), ((h+k)h*1), (h*(h+k)1*), ((h+k)k*1*), and (k*h*1*).

As shown in FIG. 4, however, in fact growth striations 20, 20 . . . such as shown in FIG. 5A and FIG. 5B were observed in the single crystal grown by pulling up the crystal in the [100] direction. If using the growth striations 20, 20 . . . as planes and reading the angle formed with the normal vector and [100] direction, the result becomes about 40 degrees (see FIG. 5A) and about 30 degrees (see FIG. 5B) and these become the (21*1) plane, the (21*1*) plane, the (100) plane, and the (11*0) plane. FIG. 4 is a view of an example of growth of $Ca_3NbGa_3Si_2O_{14}$ by the method of the related art, FIG. 5A schematically shows the growth striations of the $Ca_3NbGa_3Si_2O_{14}$ shown in FIG. 4 as seen from the [120] direction (=y-axis), and FIG. 5B is a left side view of FIG. 5A.

From the above results, the present inventors considered that they could avoid the problem of polycrystallization by suppressing growth of the 117 facet during crystal growth, considered that as a measure toward this, it would be effective to grow the crystal in a direction giving superior growth of the 111 facet corresponding to the growth striations 20 shown in FIG. 5, actually confirmed this, and thereby completed the present invention.

Note that the "direction of growth of the crystal" spoken of here is not limited to the pullup direction in the Czochralski method and means any direction in which crystal actually grows in the process of crystal growth, that is, all directions vertical to the solid-liquid interface of the crystal growth interface.

As a method for suppressing polycrystallization, first, when the pullup direction of the single crystal is the [120] direction, as shown in FIG. 6B, it is sufficient to control the direction of growth of the single crystal by limiting it to an angle such that the (21*7) plane and (21*7*) plane, which are factors behind polycrystallization, do not appear. Specifically, it is sufficient to control the direction of growth of the single crystal by limiting it to the angle (ω) formed between the normal vectors of the (21*1) plane adjoining the (21*7) plane and the (21*1*) plane adjoining the (21*7*) plane with the [100] direction. The angle ω in the present embodiment is less than 39.2 degrees, preferably not more than 38.6 degrees. Therefore, when the pullup direction of the crystal is the [100] direction, it is possible to effectively suppress polycrystallization by growing the crystal while controlling the angle (ψ) of the enlarged crystal part 30 to less than 78.4 degrees (39.2 degrees×2), preferably not more than 77.2 degrees (38.6 degrees×2). Note that if ψ is less than 78.4 degrees, the value may be close to 0 degree (90 degrees–90 degrees). The smaller the ψ value, however, the smaller the diameter of the single crystal obtained, so the lower the production efficiency of the single crystal. Therefore, the ψ value is preferably as large as possible. When crystal was actually grown with an angle of the enlarged crystal part of 70 degrees, as shown in FIG. 7, it could be confirmed that the polycrystallization could be suppressed. FIG. 6A is a schematic view of a facet when pulling up $Ca_3NbGa_3Si_2O_{14}$ in the [100] direction, FIG. 6B is a schematic view of FIG. 6A seen from the [120] direction (=y-axis), and FIG. 7 is a view of an example of growth of $Ca_3NbGa_3Si_2O_{14}$ obtained by the method of the present invention.

From the above, when pulling up the crystal in a direction rotated from [001] axis toward [100] direction, it is sufficient to pull up the crystal using a seed crystal having a lattice direction inclined by an angle of at least 50.8 degrees (=90 degrees–39.2 degrees) from the [001] axis, preferably at least 51.4 degrees (=90 degrees–38.6 degrees). Note that the inclination from the [001] axis should be at least 50.8 degrees, particularly preferably 90 degrees (90 degrees–0 degree). The closer the inclination from the [001] axis to 90 degrees, the larger the angle (ψ) of the enlarged crystal part that can be obtained and as a result the better the production efficiency of the single crystal obtained.

Second, when the pullup direction of the single crystal is the [120] direction, as shown in FIG. 8 to FIG. 10, it is sufficient to control the direction of growth of the single crystal by limiting it to an angle such that the (117) plane, (1*27) plane, (117*) plane, and (1*27*) plane, which are factors behind polycrystallization, do not appear. Specifically, it is sufficient to control the direction of growth of the single crystal by limiting it to the angle (ω) formed between the normal vectors of the (111) plane adjoining the (117) plane, the (1*21) plane adjoining the (1*27) plane, the (111*) plane adjoining the (117*) plane, and the (1*21*) plane adjoining the (1*27*) plane and the [120] direction. The angle ω in the present embodiment is less than 47.8 degrees, preferably not more than 47.4 degrees. Therefore, when the pullup direction of the crystal is the [120] direction, it is possible to suppress polycrystallization by growing the crystal while controlling the angle (ψ) of the enlarged crystal part 30 to less than 95.6 degrees (47.8 degrees×2), preferably not more than 94.8 degrees (47.4 degrees×2). Note that if ψ is less than 95.6 degrees, the value may be close to 0 degree (90 degrees–90 degrees). The smaller the ψ value, however, the smaller the diameter of the single crystal obtained, so the lower the production efficiency of the single crystal. Therefore, the ψ value is preferably as large as possible. FIG. 8 is a schematic perspective view for explaining the crystal structure of $Ca_3NbGa_3Si_2O_{14}$ obtained by the method of the present invention, FIG. 9 is a schematic view of FIG. 8 seen from the [120] direction (=y-axis), and FIG. 10 is a sectional view along the X—X line of FIG. 9 and shows the facet when pulling up the $Ca_3NbGa_3Si_2O_{14}$ in the [120] direction.

From the above, when pulling up the crystal in a direction rotated from [001] axis toward [120] direction, it is sufficient to pull up the crystal using a seed crystal having a lattice direction inclined by an angle of at least 42.2 degrees (=90 degrees−47.8 degrees) from the [001] axis, preferably at least 42.6 degrees (=90 degrees−47.4 degrees). Note that the inclination from the [001] axis should be at least 42.2 degrees, particularly preferably 90 degrees (90 degrees−0 degree). The closer the inclination from the [001] axis to 90 degrees, the larger the angle ($\psi$) of the enlarged crystal part that can be obtained and as a result the better the production efficiency of the single crystal obtained.

Third, when the pullup direction of the crystal is between the [100] direction and the [120] direction, not including the [001] direction, the smallest angle formed with the pullup direction during the growth of the 111 facet suppressing growth of the 117 facet is the angle ($\psi$) of 39.2 degrees formed between the normal vectors of the (21*1) plane and (21*1*) plane at the time of pullup in the [100] direction and the [100] direction. Therefore, when the pullup direction of the crystal does not include the [001] direction, by growing the crystal while controlling the angle ($\psi$) of the enlarged crystal part to less than 78.4 degrees (39.2 degrees×2), preferably not more than 77.2 degrees (38.6 degrees×2), it is possible to effectively suppress polycrystallization. Note that if $\psi$ is less than 78.4 degrees, it may be a value close to 0 degree (90 degrees−90 degrees), but the smaller than $\psi$ value, the smaller the size of the single crystal and as a result the lower the production efficiency of the single crystal, so the $\psi$ value preferably is as large as possible.

Due to the above, when pulling up the crystal in a direction not including the [001] direction, it is sufficient to pull up the crystal using a seed crystal having a lattice direction inclined by an angle of at least 50.8 degrees (=90 degrees−39.2 degrees) from the [001] axis, preferably at least 51.4 degrees (=90 degrees−38.6 degrees). Note that the inclination from the [001] axis should be at least 50.8 degrees, particularly preferably 90 degrees (90 degrees−0 degree). The closer the inclination from the [001] axis to 90 degrees, the larger than angle ($\psi$) of the enlarged crystal part that can be taken and as a result the more improved the productivity of the single crystal obtained.

The angle $\psi$ of the enlarged crystal part can be controlled for example by the temperature at the time of growth, the pullup speed, the output of the radio frequency generator, the output of the heater, etc.

Sr$_3$NbGa$_3$Si$_2$O$_{14}$ Composition

A crystal of the composition Sr$_3$NbGa$_3$Si$_2$O$_{14}$ was grown by pulling it up in the [001] direction, whereupon, as shown in FIG. 2, polycrystallization was observed immediately after the start of growth. FIG. 2 is a view of an example of growth of Sr$_3$NbGa$_3$Si$_2$O$_{14}$ obtained by the method of the related art.

Therefore, when growing a crystal at a pullup direction consisting of a direction inclined about 60 degrees from the [001] axis, as shown in FIG. 11, it was not possible to grow a perfect single crystal, but by pulling up the crystal in the [100] direction, as shown in FIG. 12, a transparent, crack free single crystal could be obtained. FIG. 11 is a view of an example of growth of Sr$_3$NbGa$_3$Si$_2$O$_{14}$, while FIG. 12 is a view of an example of growth of Sr$_3$NbGa$_3$Si$_2$O$_{14}$ obtained by the method of the present invention.

Due to the above, when growing a single crystal shown by the composition M$_3$NbGa$_3$Si$_2$O$_{14}$ (wherein M is an alkaline earth metal), the pullup direction of the crystal, in other words, the lattice direction of the seed crystal used, is important. Further, when desiring to grow such a single crystal with good productivity, the angle of the enlarged crystal part is important.

Relations

In the following explanation, general formulas will be found for the relations between the pullup direction of the crystal and the angle of enlargement at the shoulder (corresponding to reference numeral 30 in FIG. 6B).

First, a single crystal having a Ca$_3$NbGa$_3$Si$_2$O$_{14}$ structure belongs to the space group P321, so the c-axis is three-fold symmetry axis and the a-axis is a two-fold symmetry axis. Therefore, when the inclination from the a-axis exceed the ±30 degree range in the plane vertical to the c-axis, the inclination from the a-axis becomes equivalent to the ±30 degree range due to the three-fold symmetry axis of the c-axis.

Here, the vector v ($\theta,\phi$) of the pullup direction of the crystal pulled up in the present invention, as shown in FIG. 13, is made a direction rotated $\phi$ degrees from the [001] axis in the plane including the [001] axis toward the vector v$_a$ extending in the direction vertical to the [001] axis and rotated by $\theta$ degrees (−30≦$\theta$≦30) from the [100] axis. Due to the two-fold symmetry at the a-axis, the vector v ($\theta,\phi$) becomes equivalent to the vector v (−$\theta$,180−$\phi$). Note that in the present invention, the (117) plane and the (1*1*7) plane are equivalent, so the vector v ($\theta,\phi$) is deemed as equivalent to the vector v (−$\theta,\phi$). Therefore, the vector showing the pullup of the single crystal may be considered to be in the range of only 0≦$\theta$≦30 and 0≦$\phi$≦90.

When growing the single crystal in the pullup direction, that is, 0≦$\theta$≦30, 0≦$\phi$≦90, the 117 facet of the smallest angle with the pullup direction becomes the (21*7) plane, while the 111 facet suppressing facet growth in that direction becomes the (21*1) plane. Therefore, the angle of the enlarged crystal part enabling growth of the single crystal of the above composition has to be no more than $\psi$ shown by the formula ($\psi$=2$\omega$). Note that the angle $\omega$ is the angle formed by the normal vector of the (21*1) plane and the pullup direction v.

Further, the normal vector in the (hk1) plane is expressed, by the xyz coordinate system, as (h/a, (2k+h)/a√3, 1/c), so the normal vector of the (21*1*) plane becomes (2/a, 0, 1/c).

Further, the orientation V ($\theta,\phi$)(=pullup direction) rotated $\phi$ degrees in the v$_a$ vector direction from the c-axis in the plane vertical to the c-axis (=z-axis) and including the vector v$_a$ rotated $\theta$ degrees from the a1 axis (=x-axis) and c-axis is shown by v=(sin $\phi$ cos $\theta$, sin $\phi$ sin $\theta$, cos $\theta$).

Since $\omega$ is equal to the angle formed by the vector v and the (21*1) normal vector, $\omega$ becomes cos$^{-1}$((2 sin $\phi$ cos $\theta$/a+cos $\phi$/c)/((2/a)$^2$+(1/c)$^2$)$^{1/2}$). Therefore, $\psi$ becomes 2 cos$^{-1}$((2 sin $\phi$ cos $\theta$/a+cos $\phi$/c)/((2/a)$^2$+(1/c)$^2$)$^{1/2}$).

Further, when pulling up a Ca$_3$NbGa$_3$Si$_2$O$_{14}$ single crystal (lattice constant a =8.112 Å, c=5.078 Å) with respect to the a1 axial direction (=x-direction), since $\theta$=0 and $\phi$=90, the angle of the enlarged crystal part becomes not more than 77.2 degrees. Further, when pulling it up in the y-direction, since $\theta$=30 and $\phi$ =90, the angle of the enlarged crystal parte becomes not more than 94.8 degrees. Further, the normal vector of the (211) plane becomes (0.2465, 0, 0.1969) and $\phi$ is calculated as 51.38 degrees ($\omega$=0 degree), so in the case of a Ca$_3$NbGa$_3$Si$_2$O$_{14}$ single crystal, $\phi$ becomes the range of 51.38≦$\phi$≦90.

Similarly, when pulling up a Sr$_3$NbGa$_3$Si$_2$O$_{14}$ single crystal (lattice constant a=8.284 Å, c=5.080 Å) with respect to the a1 axial direction (=x-direction), since $\theta$=0 and $\phi$=90, the angle of the enlarged crystal part becomes not more than 78.4 degrees. Further, when pulling it up in the y-direction, since $\theta$=30 and $\phi$=90, the angle of the enlarged crystal part becomes not more than 95.68 degrees. Further, the normal vector of the (21*1) plane becomes (0.2414, 0, 0.1969) and $\phi$ is calculated as 50.80 degrees ($\omega=0$ degree), so in the case of a $Sr_3NbGa_3Si_2O_{14}$ single crystal, $\phi$ becomes the range of $50.8 \leq \phi \leq 90$.

Therefore, the relationship between the pullup orientation v of the single crystal of the composition $M_3NbGa_3Si_2O_{14}$ (where M is an alkaline earth metal) and the angle $\psi$ of the enlarged part of the crystal can be expressed by $\psi = 2 \cos^{-1}((2\sin\phi\cos\theta/a + \cos\phi/c)/((2/a)^2+(1/c)^2)^{1/2})$. Provided, however, that the $\theta$ in the formula is $0 \leq \theta \leq 30$ and $\phi$ is $50.8 \leq \phi \leq 90$.

The present disclosure relates to subject matter contained in Japanese Patent Application No. 2000-150245, filed on May 22, 2000, the disclosure of which is expressly incorporated herein by reference in its entirety.

BRIEF DESCRIPTION OF THE DRAWINGS

These and other objects and features of the present invention will be more apparent from the following description given with reference to the accompanying drawings, wherein:

FIG. 5A is a schematic view of a growth striations of the $Ca_3NbGa_3Si_2O_{14}$ shown in FIG. 4 seen from the [120] direction (=y-axis), while

FIG. 6A is a schematic view of a facet when pulling up $Ca_3NbGa_3Si_2O_{14}$ in the [100] direction, while

DESCRIPTION OF THE PREFERRED EMBODIMENTS

Figure 14:
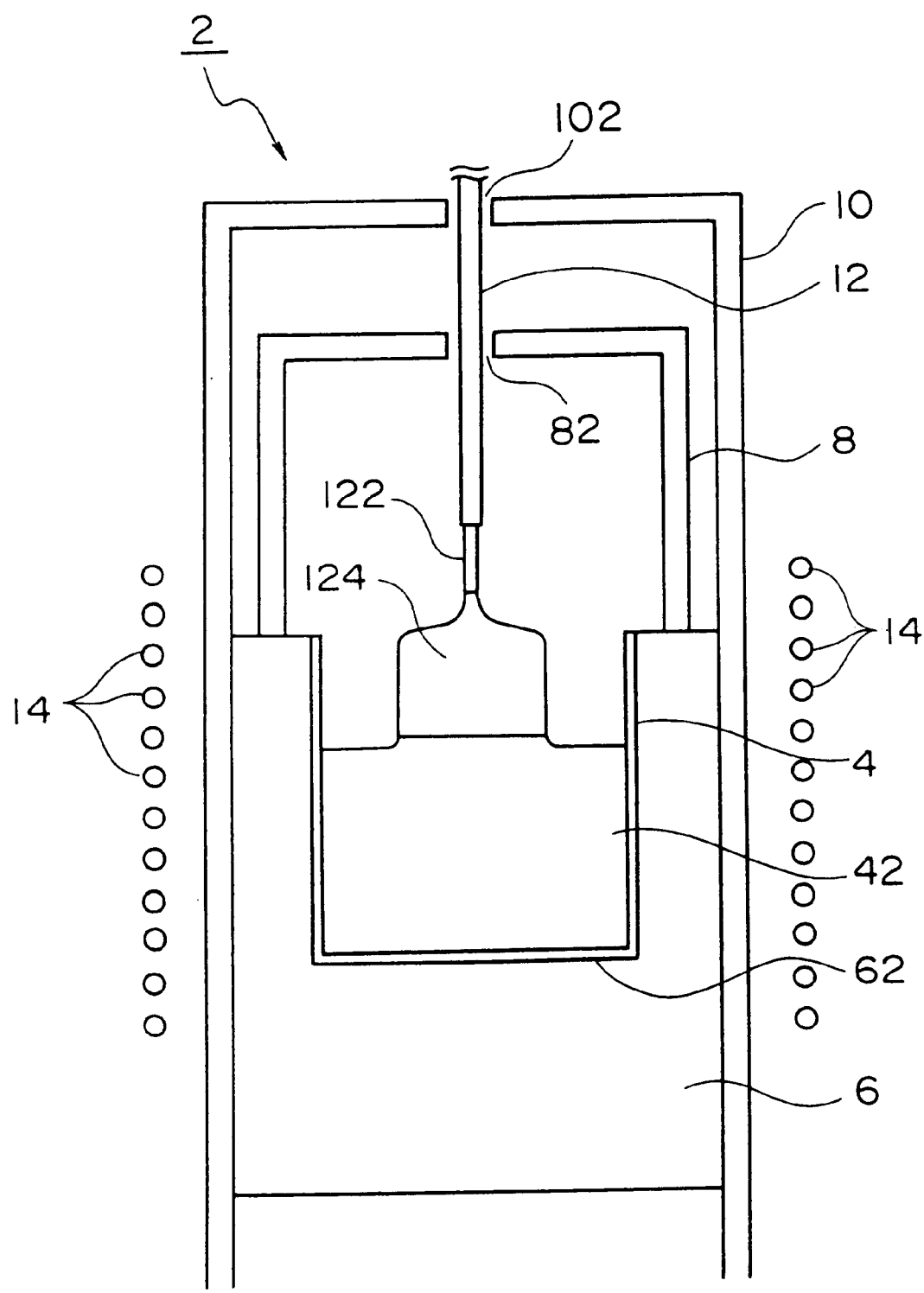
FIG. 14 is a schematic sectional view of an example of a single crystal pullup apparatus used for working the present invention.

To produce a single crystal of the composition $M_3NbGa_3Si_2O_{14}$ (where M is an alkaline earth metal) according to the present invention, it is possible to use the single crystal pullup apparatus 2 shown in for example FIG. 14.

As shown in FIG. 14, the single crystal pullup apparatus 2 according to the present embodiment has a crucible 4. The crucible 4 is arranged in a depression 62 formed in the substantial center of an adiabatic material 6. This adiabatic material 6 is covered by a refractory cylinder 8 so as to cover the crucible 4. The adiabatic material 6 and the refractory cylinder 8 are covered by a refractory housing 10.

Openings 82 and 102 are formed at substantially center positions of the top walls of the refractory cylinder 8 and the refractory housing 10. The crystal pullup shaft 12 is inserted in the openings 82 and 102 so as to be able to be pulled up while rotating.

A seed crystal 122 is attached to the lower end of the pullup shaft 12, while a drive power source (not shown) is connected to the top end of the pullup shaft 12. A radio frequency induction coil 14 is wound around a refractory housing 10. By passing a radio frequency current to the coil 14, the crucible 4 is induction heated and as a result the melt 42 in the crucible 4 is maintained at a predetermined temperature.

The single crystal pullup apparatus 2 of this configuration is used to produce a single crystal by an ordinary method, for example, the Czochralski method.

First, oxides or carbonates of elements comprising $M_3NbGa_3Si_2O_{14}$ (M being an alkaline earth metal) are mixed in the powder state to give predetermined atomic ratios, compressed into a cylindrical shape, then sintered in the atmosphere at 1000 to 1500° C. to obtained a sintered body.

Next, the obtained sintered body is placed in the crucible 4 of the air-tight single crystal pullup apparatus 2, then the sintered body is melted to obtain the melt 42 in a nitrogen atmosphere containing a small amount of oxygen.

Next, the crystal pullup shaft 12 is made to move downward so as to bring the seed crystal 122 attached to its lower end into contact with the melt 42 in the crucible. In the present embodiment, the face of which a crystal orientation inclined by an angle of 50.8 to 90 degrees, preferably 51.4 to 90 degrees, particularly preferably 90 degrees, from the [001] axis of the seed crystal 122 is brought into contact with the melt 42.

Next, the seed crystal 122 is pulled upward while causing the pullup shaft 122 to rotate so as to cause the crystal to grow and to grow the single crystal 124 while causing the deposited melt 42 to solidify. The growth conditions at this time are a crystal rotational speed of normally 1 to 100 rpm, preferably 5 to 50 rpm, and a pullup speed of the seed crystal 122 of normally 0.1 to 10 mm/hr, preferably 0.5 to 5 mm/hr.

The single crystal according to the present invention, produced in this way, is suitable used as a component of a resonator, filter, or other various piezoelectric elements.

While the invention has been described with reference to specific embodiment chosen for purpose of illustration, it should be apparent that numerous modifications could be made thereto by those skilled in the art without departing from the basic concept and scope of the invention.

Next, the present invention will be explained in further detail with reference to examples showing the embodiments of the present invention in further detail. The present invention is not however limited to only these examples.

EXAMPLE 1

Figure 7:
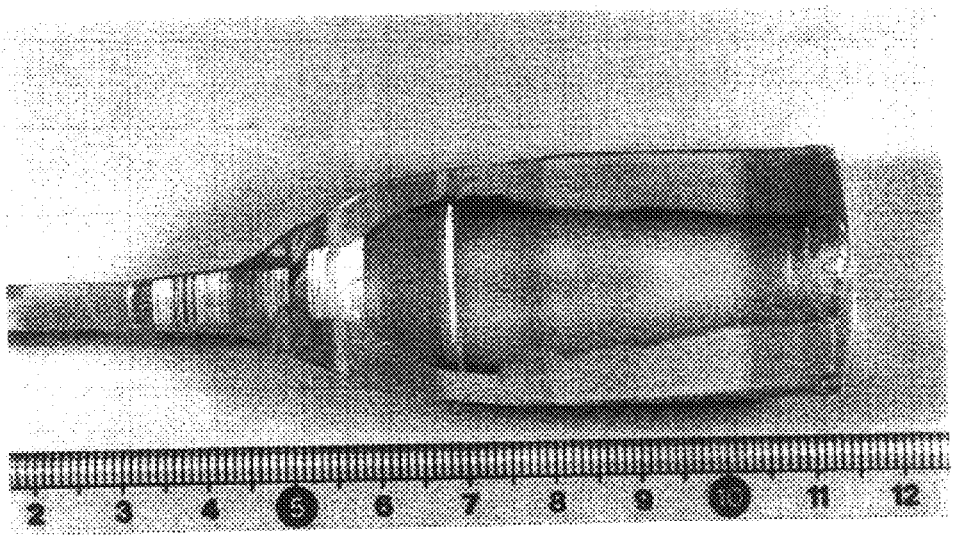
FIG. 7 is a view of an example of the growth of $Ca_3NbGa_3Si_2O_{14}$ according to the method of the present invention.
Figure 8:
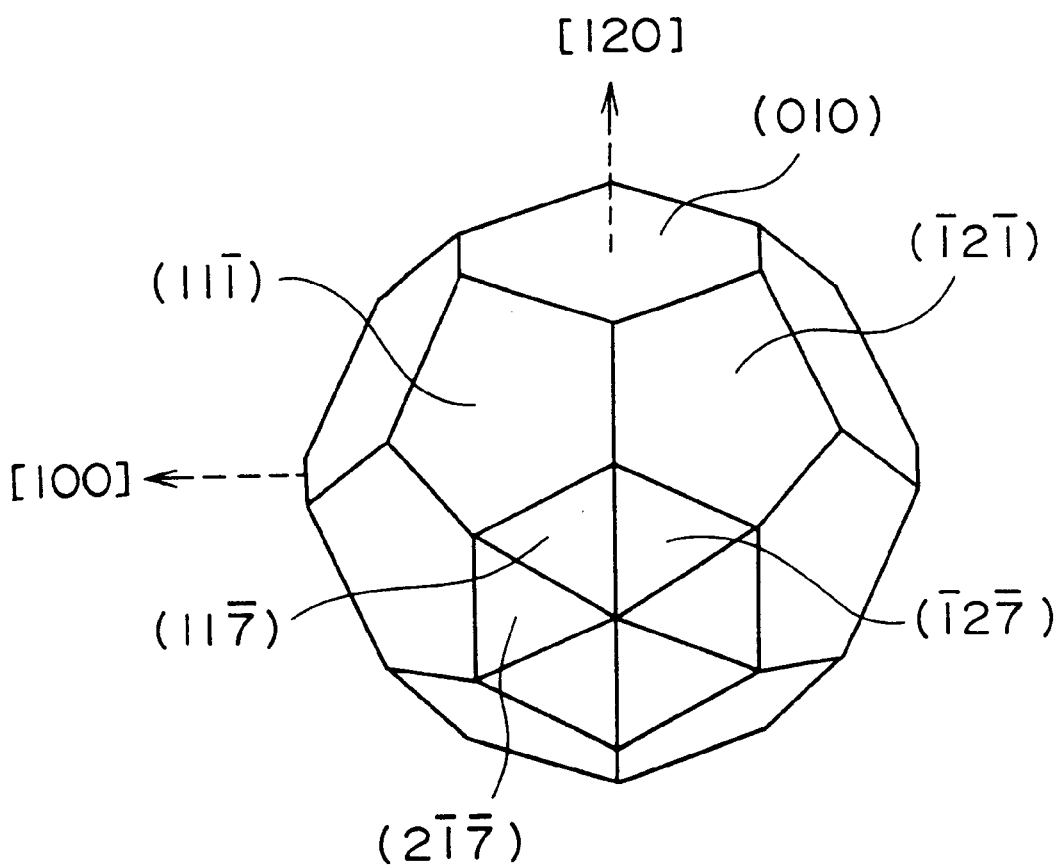
FIG. 8 is a schematic perspective view for explaining the crystal structure of $Ca_3NbGa_3Si_2O_{14}$ according to the method of the present invention.
Figure 9:
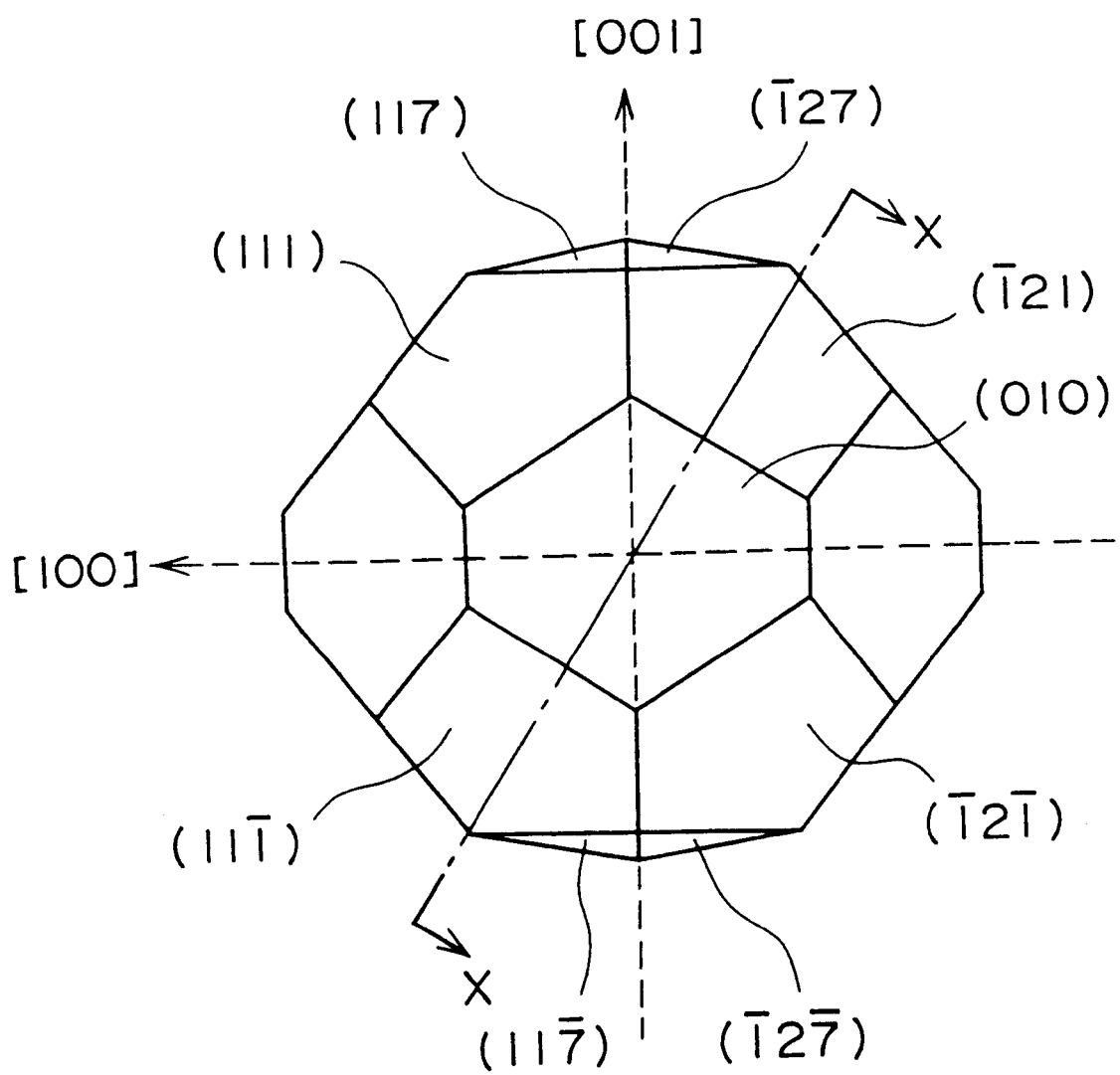
FIG. 9 is a schematic view in the case of viewing FIG. 8 seen from the [120] direction (=y-axis)
Figure 10:
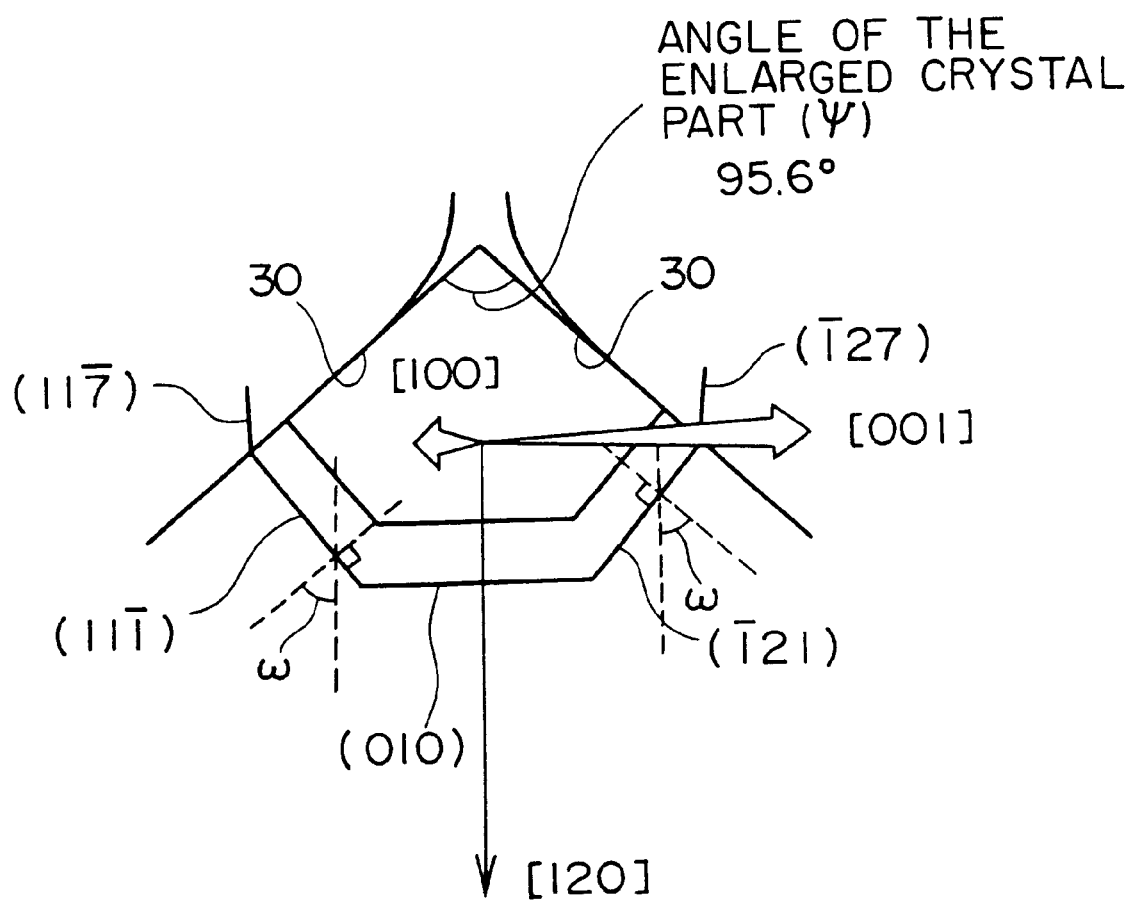
FIG. 10 is a sectional view along the line X—X of FIG. 9 and shows a view of a facet when pulling up $Ca_3NbGa_3Si_2O_{14}$ in the [120] direction.
Figure 11:
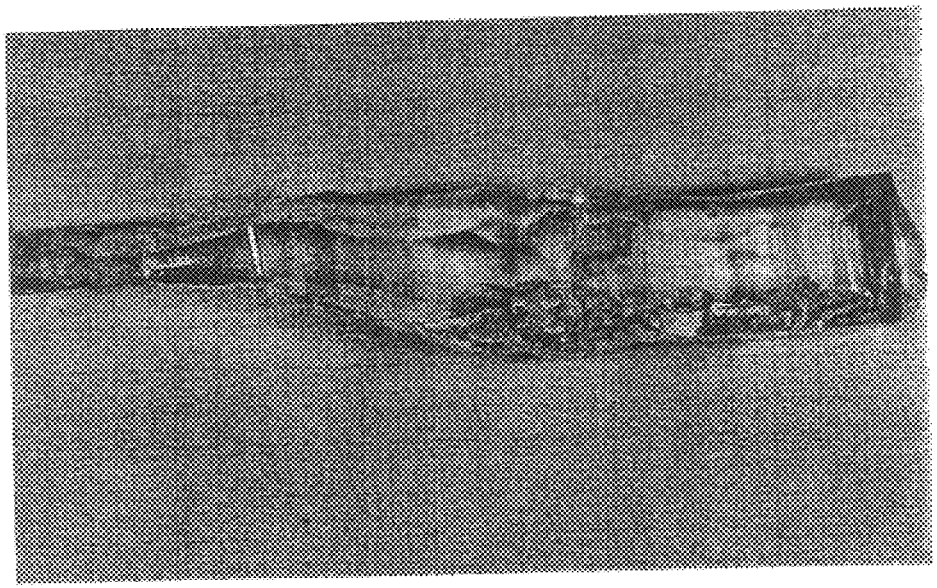
FIG. 11 is a view of an example of the growth of $Sr_3NbGa_3Si_2O_{14}$.

A radio frequency generator of a frequency of 70 kHz was used. In FIG. 14, about 250 g of $Ca_3NbGa_3Si_2O_{14}$ was inserted into an iridium (Ir) crucible 4 of a diameter of 50 mm, a height of 50 mm, and a thickness of 1.5 mm. The crystal was grown by using a $Ca_3NbGa_3Si_2O_{14}$ single crystal of a [100] direction as the seed crystal 122 in an atmosphere of 1 vol % of $O_2$ mixed in $N_2$ and pulling it up at a speed of 0.5 mm/h and an angle of the enlarged crystal part of 70 degrees, whereupon a transparent $Ca_3NbGa_3Si_2O_{14}$ single crystal of a diameter corresponding to 25 mm$\phi$ and a length of 90 mm shown in FIG. 7 was obtained.

Part of the crystal was pulverized and the phase identified by powder X-ray diffraction. As a result, the diffraction peak could be indexed as a phase having a $Ca_3Ga_2Ge_4O_{14}$ structure. The surface of the crystal was free from roughness, deposition of foreign substances, etc. and was found to be smooth and lustrous. In the crystal, no bubbles, cracks, inclusions, or other large visible defects could be observed. It could be confirmed from the orthoscope image of the polarizing microscope that the crystal was a uniform single crystal.

The single crystal obtained by the present example had a hardness of substantially the same degree as quartz and was chemically and physically stable near room temperature. Further, it was confirmed that there was no problem such as cracking under the normal processing conditions used for quartz etc., the crystal could be cut and polished, and the crystal was easy to handle.

Comparative Example 1

Figure 1:
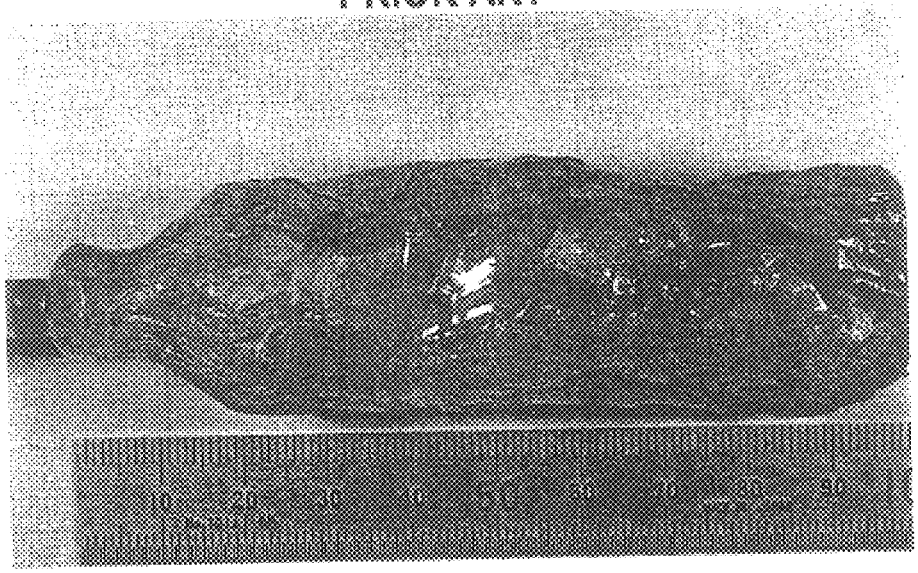
FIG. 1 is a view of an example of growth of $Ca_3NbGa_3Si_2O_{14}$ in the related art.
Figure 2:
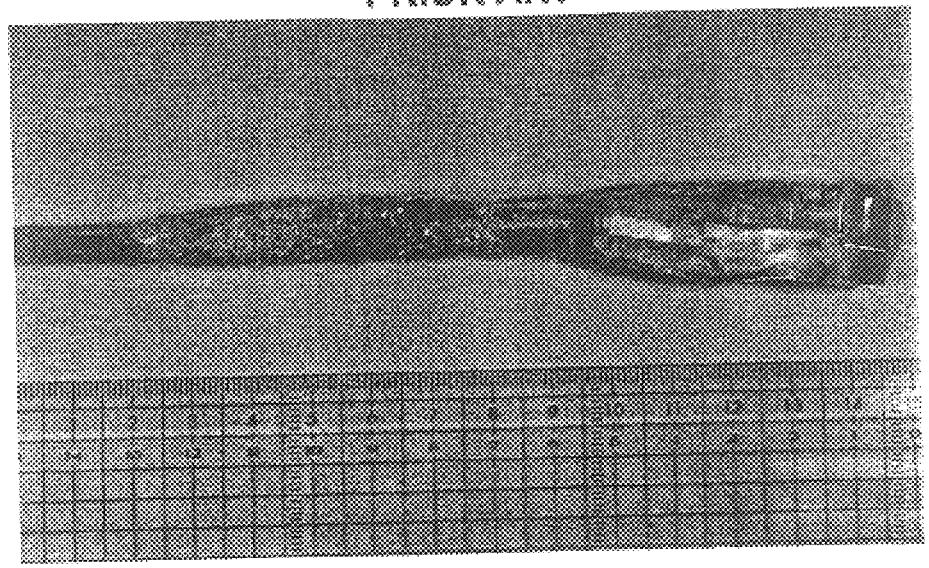
FIG. 2 is a view of an example of growth of $Sr_3NbGa_3Si_2O_{14}$ in the related art.
Figure 3:
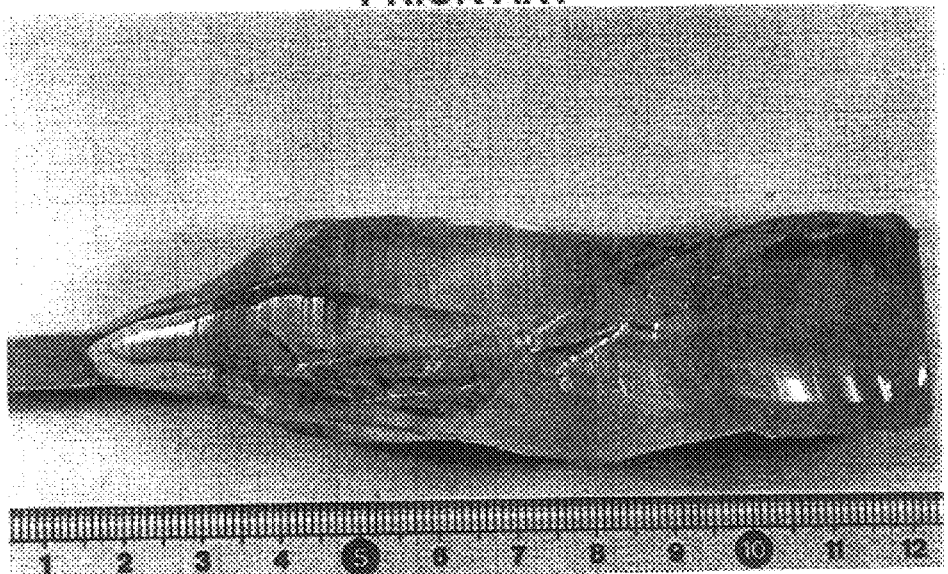
FIG. 3 is a view of an example of growth of $Ca_3NbGa_3Si_2O_{14}$ in the related art.
Figure 4:
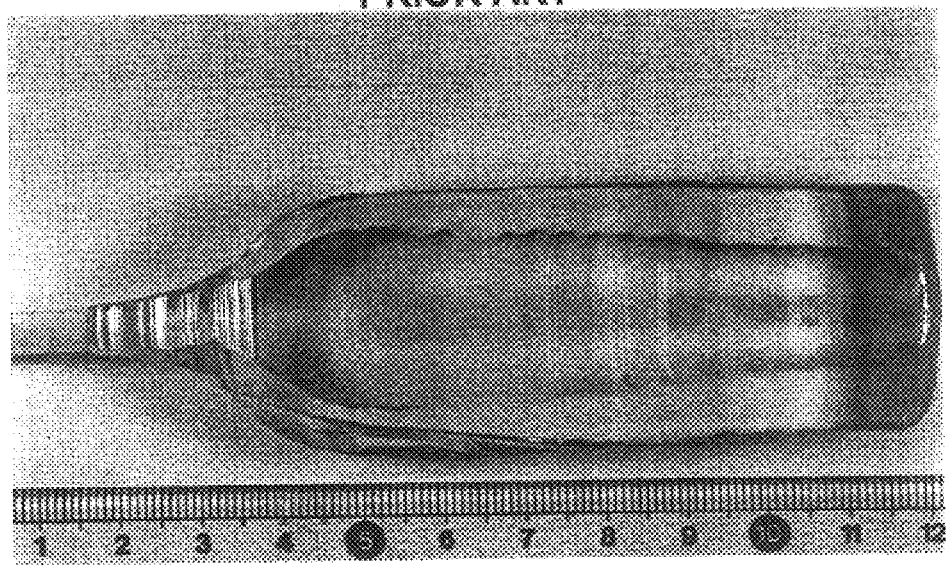
FIG. 4 is a view of an example of growth of $Ca_3NbGa_3Si_2O_{14}$ in the related art.
Figure 5A:
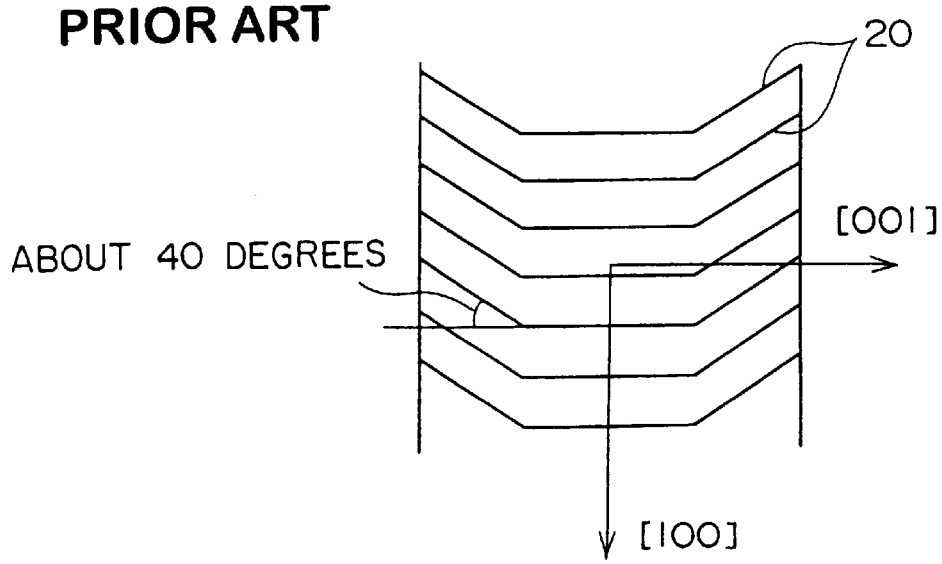
Figure 5B:
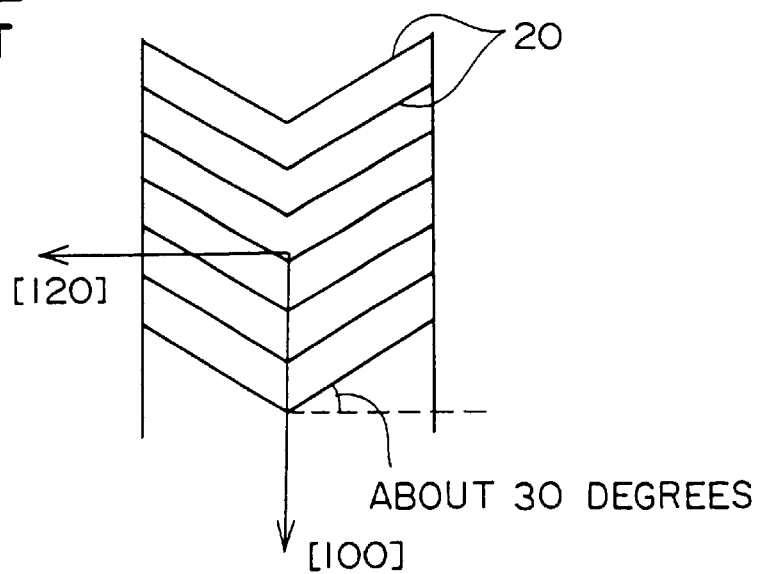
FIG. 5B is a left side view of FIG. 5A.
Figure 6A:
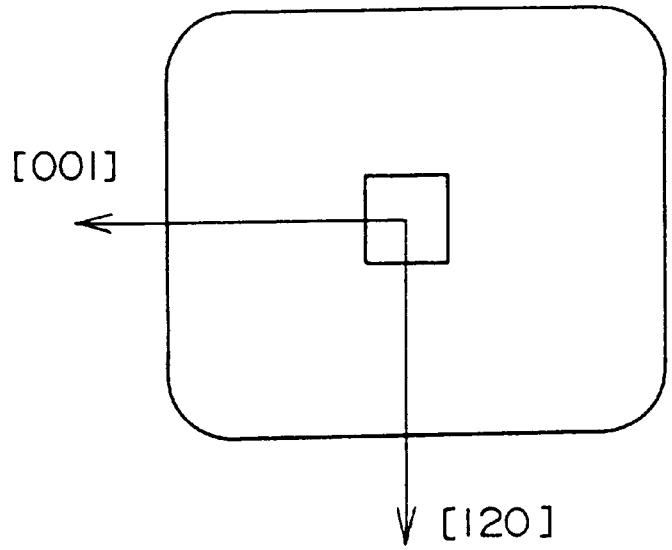
Figure 6B:
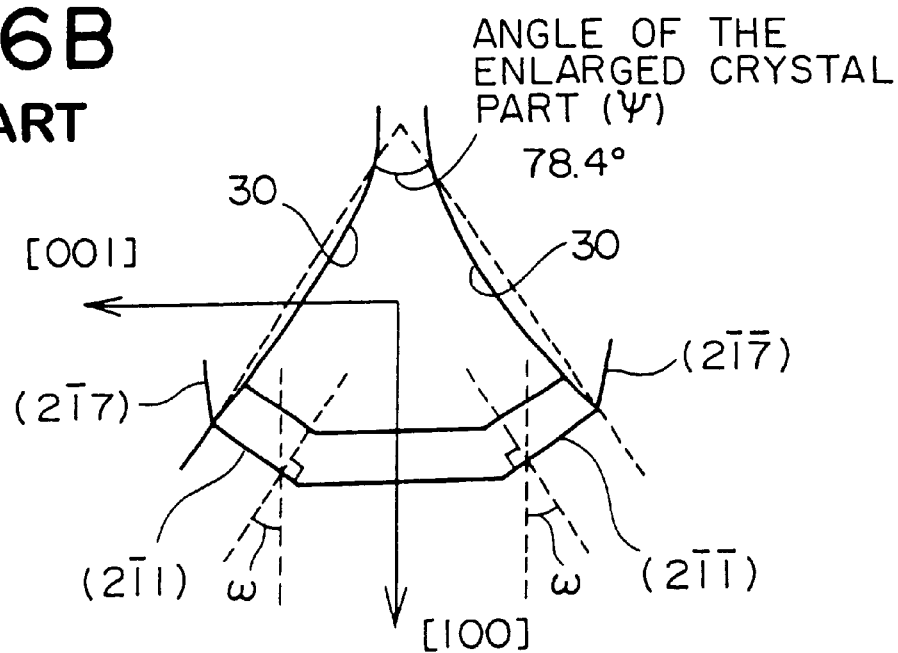
FIG. 6B is a view seen from the [120] direction (=y-axis)

A single crystal was grown under the same conditions as Example 1 except for making the angle of the enlarged crystal part 90 degrees, whereupon a twin ended up forming at the enlarged crystal part as shown in FIG. 4. The superiority of Example 1 could be confirmed in this point.

EXAMPLE 2

Figure 12:
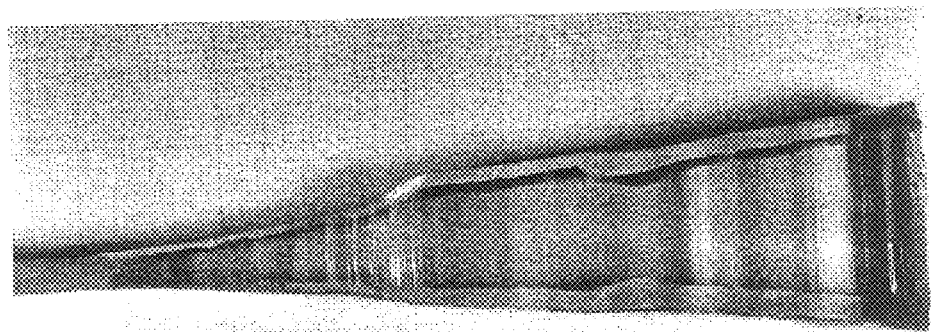
FIG. 12 is a view of an example of the growth of $Sr_3NbGa_3Si_2O_{14}$ according to the method of the present invention.
Figure 12:
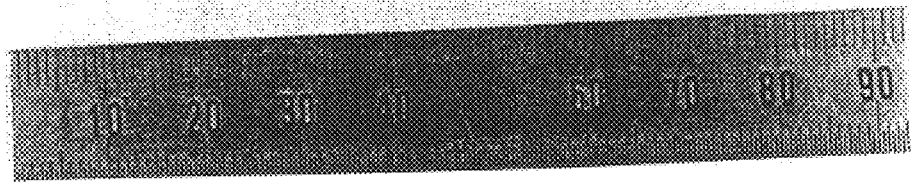
Figure 13:
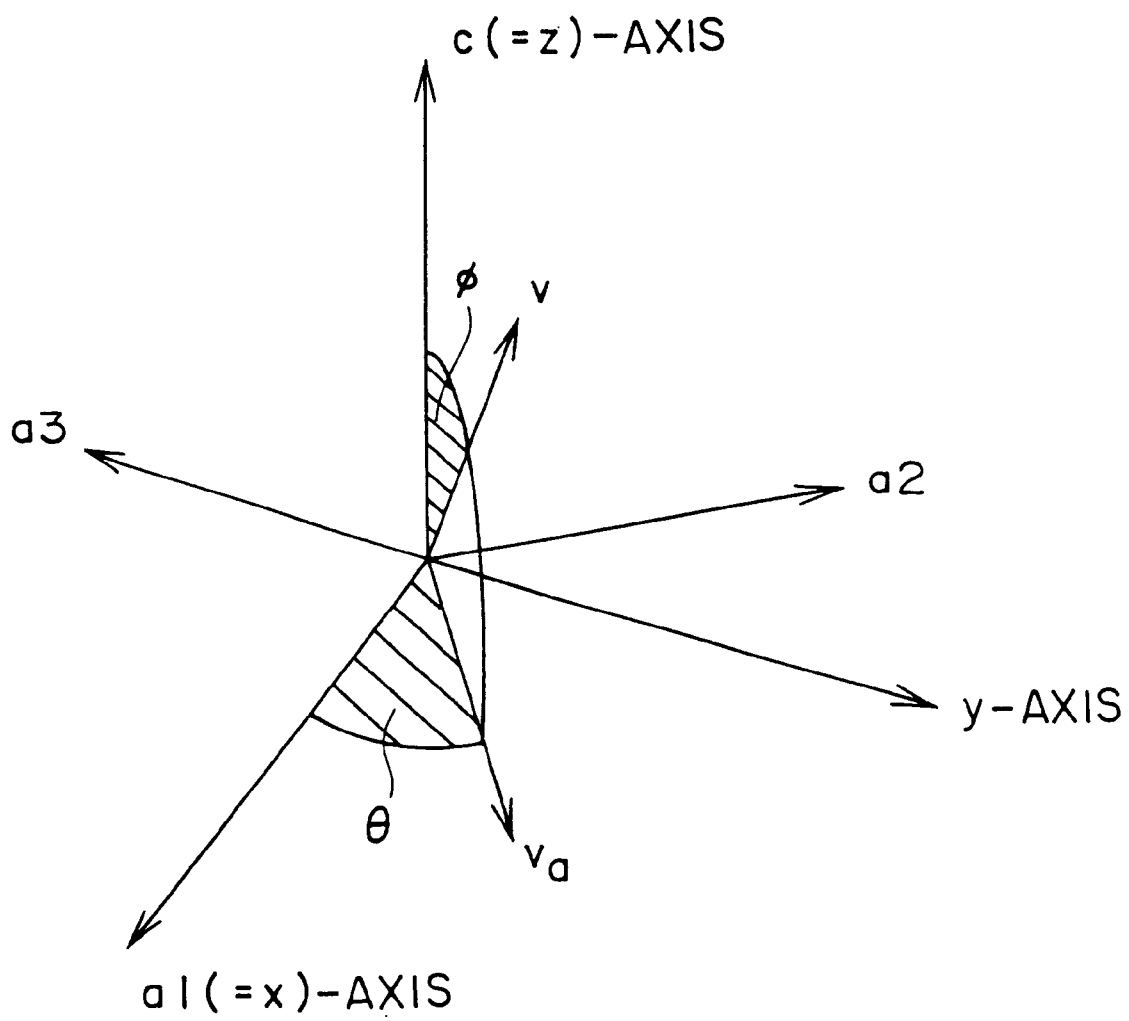
FIG. 13 is a schematic view explaining the pullup direction of the crystal.

A radio frequency generator of a frequency of 70 kHz was used. In FIG. 14, about 300 g of $Sr_3NbGa_3Si_2O_{14}$ was inserted into an iridium (Ir) crucible 4 of a diameter of 50 mm, a height of 50 mm, and a thickness of 1.5 mm. The crystal was grown by using an $Sr_3NbGa_3Si_2O_{14}$ single crystal of a [100] direction as the seed crystal in an atmosphere of 1 vol % of $O_2$ mixed in $N_2$ and pulling it up at a speed of 1.0 mm/h and an angle of the enlarged part of the crystal of 15 degrees, whereupon a transparent $Sr_3NbGa_3Si_2O_{14}$ single crystal of a diameter corresponding to 20 mm$\phi$ and a length of 85 mm shown in FIG. 12 was obtained.

In the same way as in Example 1, part of the crystal was pulverized and the phase identified by powder X-ray diffraction. As a result, the diffraction peak could be indexed as a phase having a $Ca_3Ga_2Ge_4O_{14}$ structure. The surface of the crystal was free from roughness, deposition of foreign substances, etc. and was found to be smooth and lustrous. In the crystal, no bubbles, cracks, inclusions, or other large visible defects could be observed. It could be confirmed from the orthoscope image of the polarizing microscope that the crystal was a uniform single crystal.

The single crystal obtained in the present embodiment has a hardness of substantially the same extent as quartz and is chemically and physically stable near room temperature. Further, it was confirmed that there is no problem such as cracking under the normal processing conditions used for quartz etc., the crystal could be cut and polished, and the crystal was easy to handle.

What is claimed is:

1. A seed crystal
   comprised of a composition $M_3NbGa_3Si_2O_{14}$ (where M is an alkaline earth metal) and
   having a face of which a crystal orientation inclined at an angle of 50.8 to 90 degrees from a [001] axis.

2. A single crystal
   comprised of a composition $M_3NbGa_3Si_2O_{14}$ (where M is an alkaline earth metal) and
   having a growth direction inclined at an angle of 50.8 to 90 degrees from a [001] axis.

3. A piezoelectric element
   comprised of a single crystal including a composition $M_3NbGa_3Si_2O_{14}$ (where M is an alkaline earth metal) and
   having a growth direction inclined at an angle of 50.8 to 90 degrees from a [001] axis.

4. A method of producing a single crystal of a composition $M_3NbGa_3Si_2O_{14}$ (where M is an alkaline earth metal) comprising growing the crystal in a lattice direction inclined by an angle of 50.8 to 90 degrees from a [001] axis.

5. The method of producing a single crystal as set forth in claim 1, wherein the single crystal is grown at an angle ($\psi$) of an enlarged crystal part of the crystal so as to satisfy the following formula when a pullup direction of the single crystal of said composition is made a direction "v" rotated by $\phi$ $50.8 \leq \phi \leq 90$) from the [001] axis in a plane including the [001] axis toward a vector "$v_a$" extending in a direction vertical to the [001] axis and rotated $\theta$ ($0 \leq \theta \leq 30$) from a [100] axis, "a" and "c" are lattice constants, and $\psi$ is an angle of the enlarged crystal part:

$$\psi \leq 2 \cos^{-1}((2 \sin \phi \cos \theta/a + \cos \phi/c)/((2/a)^2+(1/c)^2)^{1/2}).$$

6. The method of producing a single crystal as set forth in claim 5, wherein said alkaline earth metal is any one of Ca and Sr.

7. The method of producing a single crystal as set forth in claim 5, wherein the crystal is grown at the angle of the enlarged crystal part of less than 78.4 degrees when pulling up the crystal in the [100] direction.

8. The method of producing a single crystal as set forth in claim 5, wherein the crystal is grown at the angle of the enlarged crystal part of less than 95.6 degrees when pulling up the crystal in the [120] direction.

9. The method of producing a single crystal as set forth in claim 1, wherein said alkaline earth metal is any one of Ca and Sr.

10. A method of producing a single crystal comprising pulling a seed crystal up while bringing a face of which a crystal orientation, inclined at an angle of 50.8 to 90 degrees from a [001] axis of the seed crystal, into contact with a melt in a crucible, so that a single crystal of a composition $M_3NbGa_3Si_2O_{14}$ (where M is an alkaline earth metal) is grown at a lower end of the seed crystal.

11. The method of producing a single crystal as set forth in claim 10, wherein the single crystal is grown at an angle ($\psi$) of an enlarged crystal part of the crystal so as to satisfy the following formula when a pullup direction of the single crystal of said composition is made a direction "v" rotated by $\phi$ ($50.8 \leq \phi \leq 90$) from the [001] axis in a plane including the [001] axis toward a vector "$v_a$" extending in a direction vertical to the [001] axis and rotated $\theta$ ($0 \leq \theta \leq 30$) from a [100] axis, "a" and "c" are lattice constants, and $\psi$ is an angle of the enlarged crystal part:

$$\psi \leq 2 \cos^{-1}((2 \sin \phi \cos \theta/a + \cos \phi/c)/((2/a)^2+(1/c)^2)^{1/2}).$$

12. The method of producing a single crystal as set forth in claim 11, wherein said alkaline earth metal is any one of Ca and Sr.

13. The method of producing a single crystal as set forth in claim 11, wherein the crystal is grown at the angle of the enlarged crystal part of less than 78.4 degrees when pulling up the crystal in a [100] direction.

14. The method of producing a single crystal as set forth in claim 11, wherein the crystal is grown at the angle of the enlarged crystal part of less than 95.6 degrees when pulling up the crystal in a [120] direction.

15. The method of producing a single crystal as set forth in claim 10, wherein said alkaline earth metal is any one of Ca and Sr.

* * * * *